United States Patent [19]

Tarng et al.

[11] 4,349,408
[45] Sep. 14, 1982

[54] METHOD OF DEPOSITING A REFRACTORY METAL ON A SEMICONDUCTOR SUBSTRATE

[75] Inventors: Ming L. Tarng, Mercerville, N.J.; Walter A. Hicinbothem, Jr., Levittown, Pa.

[73] Assignee: RCA Corporation, New York, N.Y.

[21] Appl. No.: 248,038

[22] Filed: Mar. 26, 1981

[51] Int. Cl.$^3$ ............... H01L 21/285; H01L 21/308; H01L 21/314; H01L 21/32
[52] U.S. Cl. .................. 156/628; 29/590; 156/653; 156/657; 156/662; 357/54; 357/59; 427/91; 427/253; 427/307
[58] Field of Search ............. 156/628, 653, 656, 657, 156/662; 204/192 E; 29/590, 591; 357/54, 59; 427/91, 253, 307

[56] References Cited

U.S. PATENT DOCUMENTS

| | | | |
|---|---|---|---|
| 3,785,862 | 1/1974 | Grill | 117/217 |
| 3,892,606 | 7/1975 | Chappelow et al. | 156/657 |
| 3,906,540 | 9/1975 | Hollins | 357/15 |
| 3,945,030 | 3/1976 | Seales | 29/590 |
| 4,062,033 | 12/1977 | Suzuki | 357/15 |
| 4,085,498 | 4/1978 | Rideout | 156/657 |
| 4,086,613 | 4/1978 | Biet et al. | 357/54 |
| 4,119,992 | 10/1978 | Ipri et al. | 357/4 |
| 4,282,647 | 8/1981 | Richman | 357/54 |
| 4,297,149 | 10/1981 | Koons et al. | 357/59 |
| 4,322,453 | 3/1982 | Miller | 427/91 |

FOREIGN PATENT DOCUMENTS

| | | | |
|---|---|---|---|
| 55-95339 | 7/1980 | Japan | 156/653 |
| 711167 | 1/1980 | U.S.S.R. | 427/253 |

OTHER PUBLICATIONS

Morosanu et al. "Thin Film . . . Reactor" Vacuum, vol. 31, No. 7, (1-19-81), pp. 309-313.

Primary Examiner—Jerome W. Massie
Attorney, Agent, or Firm—Birgit E. Morris; Donald S. Cohen; Robert P. Seitter

[57] ABSTRACT

A method for depositing a refractory on a semiconductor substrate passivated with silicon dioxide and/or oxygen doped polycrystalline silicon is disclosed. The usual undercutting of the oxygen doped polycrystalline silicon or of the silicon substrate at the edge where it meets the oxide is prevented by depositing a layer of phosphorus doped polycrystalline silicon over the passivation material before the metal is deposited.

8 Claims, 5 Drawing Figures

METHOD OF DEPOSITING A REFRACTORY METAL ON A SEMICONDUCTOR SUBSTRATE

BACKGROUND OF THE INVENTION

This invention relates to a method of depositing a refractory metal on a semiconductor substrate and, more particularly, to such a method wherein a passivation material is also deposited around the periphery of the metal.

In the semiconductor industry it is often necessary to deposit a refractory metal on a predetermined surface area of a semiconductor substrate and to also deposit a passivation material around the periphery of that metal. As an example, Schottky diodes include a metal contact on the surface of a silicon substrate to form a rectifying junction. The passivation material surrounds the edge of this contact to enhance the forward and reverse operating characteristics of the diode. When manufacturing these diodes, it is usual to coat the surface of the substrate with a passivation material, form a window in the passivation material to expose a predetermined surface area of the substrate and deposit the metal on this surface area.

Various passivation materials have been utilized including silicon dioxide ($SiO_2$), semi-insulating materials such as oxygen doped polycrystalline silicon (SIPOS) and combinations thereof. The use of oxygen doped polycrystalline silicon either alone or covered by a layer of silicon dioxide has come to be preferred because of its enhanced passivation properties. For providing the contact, the use of refractory metals has been preferred because of their thermal stability and, recently, the use of tungsten (W) and molybdenum (Mo) deposited by Chemical Vapor Deposition (CVD) techniques have become most preferred.

The use of a CVD technique provides significant advantages over the more usual evaporation and sputtering deposition techniques. First, the metal adheres better to the silicon substrate due to the chemical interaction between the metal and the silicon. Second, a desirable metal silicide is automatically formed beneath the substrate surface adjacent the metal. This eliminates the need for high temperature alloying of the deposited metal and also avoids the exposure of the metal to the corrosive environment used in such alloying. Third, the refractory metal is deposited on the silicon, but not the usual outer oxide of the passivant system. This enables the refractory to be completely covered by a corrosion resistant film.

When forming schottky diodes using oxide or a combination of oxygen doped polycrystalline silicon and oxide in combination with a refractory metal contact deposited by CVD techniques, several problems have been realized. A most critical problem involves the formation of a severe undercut in the silicon substrate that is formed at the edge of the window where the silicon meets the oxide layer or where the oxygen doped polycrystalline silicon meets the oxide layer, depending upon the particular passivation material. This undercut is formed when the metal is deposited on the substrate and it severely degrades the forward and reverse operating characteristics of the device.

SUMMARY OF THE INVENTION

This invention provides a method of depositing a refractory metal on a semiconductor substrate without undercutting the silicon substrate during that process. This is accomplished by depositing an oxygen doped polycrystalline silicon layer on one surface of the semiconductor substrate and then depositing a phosphorus doped polycrystalline silicon layer on the outermost surface of the first layer. Thereafter, windows are etched in the layers to expose surface areas of the substrate where the metal is to be deposited. Afterwards, the refractory metal is deposited on the exposed surface areas of the substrate.

Various other advantages resulting from this invention will be pointed out where appropriate during the description of a detailed embodiment.

DETAILED DESCRIPTION OF A PREFERRED EMBODIMENT

Figure 1:
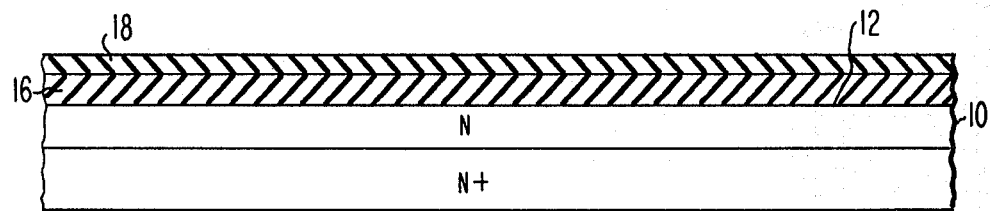
FIGS. 1-5 of the drawing illustrate, in section, a semiconductor substrate at various times when practicing this invention to form a Schottky diode.

The invention will be explained with particular reference to making a Schottky diode, but it should be understood that this invention can be used to make a variety of other devices. Referring now to FIG. 1, there is illustrated a conventional wafer or substrate 10 of semiconductor material, preferably silicon, in which a plurality of semiconductor devices are to be made. Specific reference will be made to the manufacture of a single semiconductor device, but it should be understood that a plurality of such devices are normally formed on a single substrate. The substrate 10 has a pair of parallel major surfaces 12 and 14 and is appropriately doped with N type impurity atoms, for example, phosphorus, so as to have a heavily doped region, denoted by N+ on the drawing, adjacent the surface 14 and a more lightly doped region, denoted by N, adjacent the surface 12. While the particular description here involves the use of N type dopant, P type dopant could also be utilized. Still referring to FIG. 1 of the drawing, a layer 16 of semi-insulating material is deposited on the surface 12 of the substrate. In practicing this invention, the use of polycrystalline silicon doped with oxygen atoms within a range of 2 to 45 atomic percent of oxygen is preferred with a range of about 15 to 30 atomic percent being most preferred.

The deposition of the oxygen doped polycrystalline silicon layer 16 is accomplished with a chemical vapor deposition (CVD) technique at either low or atmospheric pressure. In using such a technique, the substrate 10 is placed in a CVD reactor (not shown in the drawing) connected, via suitable valving, to sources of nitrous-oxide ($N_2O$) and silane ($SiH_4$). The substrate is heated in the reactor to a temperature of between about 600° C. and 750° C., for example to approximately 670° C., and the nitrous oxide and silane are fed into the reactor in a ratio of about 0.2 to 0.4 for a period of time sufficient to deposit an oxygen doped polycrystalline silicon layer 16 of about 5,000 Angstroms thick.

In accordance with this invention, a phosphorus doped polycrystalline silicon layer 18 is deposited on the exposed surface of the oxygen doped polycrystalline layer 16 so as to completely cover the latter. The polycrystalline silicon layer 18 has a phosphorus doping concentration of at least about $10^{19}$ atoms/$cm^3$ and has an initial thickness of about 3,000 Angstroms. Conveniently, this deposition can be accomplished by a CVD technique in the same reactor used to deposit the oxygen doped polycrystalline layer 16. To accomplish this, the reactor is also connected via suitable valving to a source of hydrogen phosphide (PH$_3$), more commonly referred to as phosphine. After deposition of the layer 16, the flow of the nitrous-oxide and silane is discontinued and the substrate 10 is cooled to a temperature of between about 550° C. and 650° C., preferably to about 600° C., and that temperature is maintained while phosphine and silane are fed into the reactor in a ratio of about 1 to 3,000. The phosphine is preferably mixed with nitrogen (N$_2$) and the phosphine content of the mixture is about 500 parts per million. This continues until the layer 18 is deposited on the layer 16.

Figure 2:
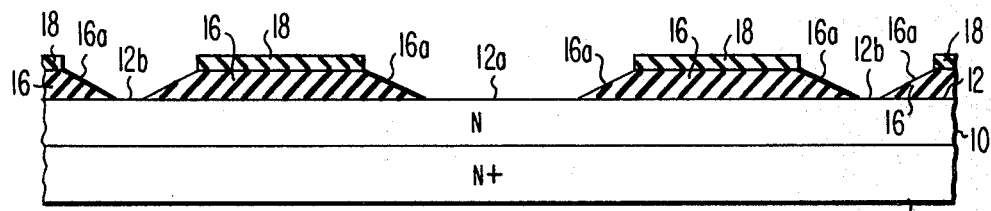

Referring now to FIG. 2, windows are formed in the layers 16 and 18 to expose surface areas 12a and 12b of the substrate 10. As will be made clear hereinafter, the surface areas 12a are those areas where metal contact is to be made to form the Schottky barrier and surface areas 12b define the areas where the individual semiconductor devices are to be separated from each other. These windows are formed in accordance with generally conventional photolithographic techniques wherein a photoresist is placed over the exposed surface of the phosphorus doped polycrystalline silicon layer 18 and is then masked and treated to define unprotected areas corresponding to the surface areas 12a and 12b and to protect the remaining area of the layer 18. With the treated photoresist in place, the layers 16 and 18 are etched in a solution of nitric (HNO$_3$) and hydrofluoric (HF) acid, preferably a solution of 70% by volume nitric and 40% by volume hydrofluoric in a ratio of about 99.0 to about 0.5. This removes the phosphorus doped polycrystalline silicon and the oxygen doped polycrystalline silicon to expose the silicon substrate in the areas 12a and 12b. Because the faster etch rate of the phosphorus doped polycrystalline silicon relative to the oxygen doped polycrystalline silicon, the peripheral edges of the oxygen doped polycrystalline silicon surrounding the exposed silicon surface areas 12a and 12b are formed with a desirable taper illustrated at 16a in FIG. 2 of the drawing. The tapers 16a provide better adhesion for the material subsequently deposited on the exposed silicon surface areas 12a and 12b.

The photoresist is now stripped from the outer surface of the phosphorus doped polycrystalline silicon layer 18 and the wafer appears as illustrated in FIG. 2 of the drawing. At this point, both the oxygen doped and the phosphorus doped polycrystalline silicon layers 16 and 18, respectively, are annealed.

Figure 3:
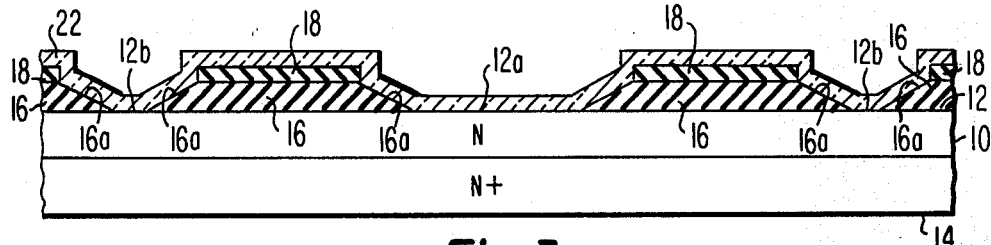

It has been found preferable to deposit an oxide layer 22 over the now exposed surfaces 12a and 12b of the substrate 10 as well as over the phosphorus doped polycrystalline silicon layer 18 and seen in FIG. 3. In accordance with one aspect of this invention, the oxide layer 22 can be formed while annealing the oxygen and phosphorus doped polycrystalline silicon layers 16 and 18, respectively. This can also be done in a CVD reactor connected, via suitable valving, to sources of steam and hydrogen chloride (HCl). The substrate 10 illustrated in FIG. 2 is placed in the reactor and heated to a temperature of about 900° C. The steam and about 1% to 10% hydrogen chloride acid are fed into the reactor for a period of about 30 minutes to thermally grow a 2,500 Angstrom thick oxide layer 22. On the exposed surface areas 12a and 12b of the substrate 10 and on the exposed surface areas of the oxygen doped polycrystalline silicon 16, silicon dioxide (SiO$_2$) is formed; on the exposed surface areas of the phosphorus doped polycrystalline silicon layer 18, the phosphorus reacts with the steam and a phosphosilicate glass (an amorphous mixture of silicon dioxide and phosphorus pentoxide (P$_2$O$_5$)) is formed. Formation of the phosphosilicate glass is highly desirable since it is an effective ion getterer which adds to the long term stability of the device being formed. Additionally, the phosphosilicate glass enables the subsequent selective deposition of metal and prevents surface leakage.

Figure 4:
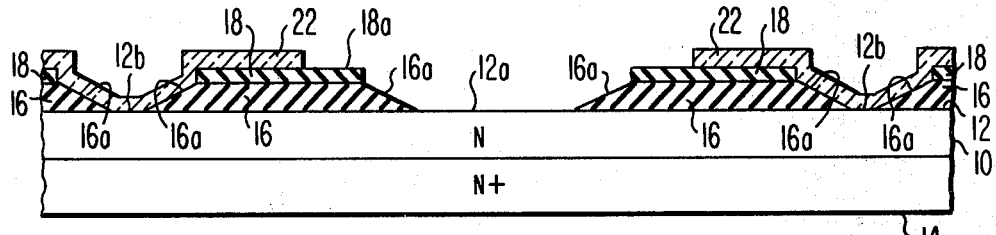

After the oxide layer 22 is grown, its exposed surface is coated with a photoresist which is then treated in accordance with generally conventional photolithographic techniques to define unprotected windows adjacent the silicon surface areas 12a the tapered surface areas 16a and a peripheral surface area 18a of the phosphorus doped polycrystalline silicon layer. The peripheral surface area 18a is located adjacent to and outwardly of the tapered surface 16a. Once these windows have been formed, the unprotected oxide layer 22 is etched away in a buffered hydrofluoric (HF) acid to expose the silicon surface areas 12a, the tapered edges 16a of the oxygen doped polycrystalline silicon layer 16, and the peripheral edges 18a of the phosphorus doped polycrystalline layer 18 as illustrated in FIG. 4. The oxide layer 22 is not removed adjacent the silicon surface layers 12b so that when the devices are separated from each other, the oxide is in place for passivation purposes.

With the substrate 10 in the condition illustrated in FIG. 4, it is now ready for metal deposition to form the Schottky diode. To accomplish this, a metal contact 24 is deposited over the exposed silicon surface areas 12a. Refractory metal is preferred for the contact 24 and the use of tungsten or molybdenum deposited by CVD techniques is most preferred. In accordance with a CVD technique, tungsten (W) can be deposited on the surface areas 12a by placing the substrate as illustrated in FIG. 4 in a CVD reactor and heating the substrate to a temperature within the range of about 500° C. to about 800° C. Tungsten hexafluoride (WF$_6$) and an inert carrier gas such as argon (Ar) or nitrogen (N$_2$) are then fed into the reactor and the tungsten hexafluoride will react with the silicon in accordance with the following:

$$2WF_6 + 3Si \rightarrow 2W \downarrow + 3SiF_4 \uparrow$$

Preferably, the temperature of the substrate 10 is at least about 600° C. to about 800° C. and most preferably is about 700° C. so that a tungsten silicide layer is formed in the silicon beneath the exposed surface areas 12a. Afterwards, tungsten atoms will replace silicon atoms in accordance with the above reaction and a tungsten layer 24 forms in the exposed surface areas 12a, the tapered surfaces 16a, and the exposed surfaces 18a. The tungsten will not form on the phosphosilicate glass portion of the oxide layer 22, but trace amounts may be deposited on the silicon dioxide portion.

The deposition of tungsten will stop after a layer of from about 500 angstroms to about 2,000 Angstroms thick has been deposited. Inasmuch as a layer of about 4,000 Angstroms thick is desired, the deposition process must be altered. In order to deposit the additional 2,000 Angstroms to 3,500 angstroms of tungsten, the temperature is lowered from the 600° C. to 800° C. previously used to a temperature of about 500° C. to about 650° C., preferably to about 550° C. At this point, hydrogen (H$_2$) is added to the tungsten hexafluoride and carrier gas. The tungsten hexafluoride will react with the hydrogen to deposit the desired additional tungsten in accordance with the following:

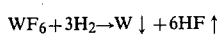

The ratio of hydrogen to tungsten hexafluoride should be at least about and preferably greater than 10 to 1.

EXAMPLE OF TUNGSTEN DEPOSITION

A tungsten layer was deposited by atmospheric CVD on a substrate prepared in accordance with the preferred Detailed Description relating to FIGS. 1-4. This substrate was placed in a CVD reactor chamber and the chamber was heated to a temperature of approximately 700° C. The chamber was pumped down to a vacuum and was then argon back filled to provide an argon atmosphere at a positive pressure. Additional argon, functioning as a carrier gas, was fed into the reactor chamber at the rate of 3 liters/minute and tungsten hexafluoride was pulsed into that chamber at the rate of 15 cc/minute. A total of 14 pulses were fed into the chamber with each pulse being 20 seconds in duration. The elapsed time between pulses was 40 seconds. This process formed the tungsten silicide layer and deposited a layer of tungsten on the substrate, the layer having a thickness of about 1,000 Angstroms. No tungsten was deposited on the oxide surface during this deposition process.

When the reaction in accordance with the first equation above stopped, the temperature in the reactor chamber was lowered to approximately 550° C. Hydrogen was then fed into the chamber at the rate of 8 liters/minute and argon flow at the rate of 3 liters/minute was continued. Tungsten hexafluoride was again pulsed into the chamber at the rate of 15 cc/minute. A total of ten pulses were fed into the chamber with each pulse being 20 seconds in duration. The elapsed time between pulses was again 40 seconds. Additional tungsten was deposited on that previously deposited and the total thickness of the tungsten layer was approximately 4,000 Angstroms. When the substrate was examined, neither the silicon nor the oxygen doped polycrystalline silicon were undercut. Tungsten islands were formed on the oxide surface during this second deposition process. These isolated tungsten islands do not conduct current and, thus, will not adversely affect the quality of the passivation. Moreover, these islands improve the adhesion of any subsequent metal deposited over the oxide surfaces.

Figure 5:
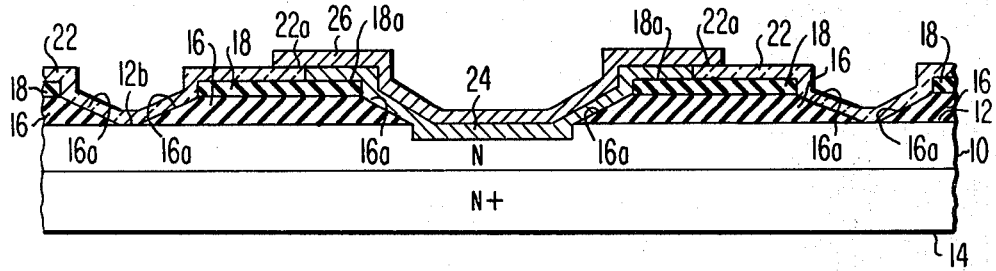

Returning to the detailed description of a preferred embodiment, it is desirable to deposit a corrosion resistant metal film over the tungsten and any suitable metal and depositing technique can be utilized. It is preferred that a platinum layer 26, as illustrated in FIG. 5, be deposited with a thickness of about 2,000 Angstroms. This can be accomplished by placing an additional photoresist over the substrate, and then processing it in accordance with generally conventional photolithographic techniques to expose a peripheral portion 22a of the oxide layer 22 adjacent the tungsten layer 24 as well as the entire surface area of that tungsten layer. The platinum is then deposited in accordance with any conventional technique and, the photoresist is removed. The platinum deposited on the photoresist can be removed by the "lift-off" technique. This is done by immersing the substrate 10 into a stripper such as acetone. As the photoresist is dissolved, the platinum layer on it is lifted off and removed automatically.

As seen in FIG. 5, the outer peripheral edge of the tungsten layer 24 is covered and protected by the platinum layer 26. This is in contrast to conventional deposition methods wherein the outer edge of the contact metal is exposed and subject to corrosion and degradation during subsequent processing.

A plurality of Schottky diodes have now been formed on the substrate 10. Further processing is in accordance with generally accepted techniques to provide further metallization layers, separate the individual diodes from each other at the surface areas 12b and package the individual diodes.

From the foregoing it can be seen that a method has been provided for depositing a refractory metal on a semiconductor substrate utilizing passivant materials for the mask without undercutting the silicon substrate or the oxygen doped polycrystalline silicon. In addition, various other advantages of the technique have been pointed out in the detailed description of a preferred embodiment of the invention. It should be obvious to those skilled in the art that various changes and modifications can be made without departing from the true spirit and scope of the invention as recited in the appended claims.

We claim:

1. A method of depositing a refractory metal on a silicon substrate, said method comprising:
   depositing an oxygen doped polycrystalline silicon layer on one surface of said substrate;
   depositing a phosphorus doped polycrystalline silicon layer on the outer surface of said oxygen doped polycrystalline silicon layer, said phosphorous doped polycrystalline silicon layer having a phosphorous concentration of at least about $10^{19}$ atoms/cm$^3$;
   etching windows in said layers to expose said surface of said substrate in the areas where said refractory metal is to be deposited; and,
   heating said substrate to a temperature in a range of between about 500° C. to about 800° C. and then exposing said substrate to a gaseous refractory metal hexafluoride wherein the refractory metal of said hexafluoride is selected from the group consisting of tungsten and molybdenum.

2. A method in accordance with claim 1 wherein a layer of oxide is grown on the outer surface of said phosphorus doped polycrystalline silicon layer.

3. A method in accordance with claim 1 wherein a corrosion resistant film is deposited on the outer surface of said refractory metal.

4. A method in accordance with claim 1 wherein said oxygen doped polycrystalline layer contains oxygen in the range of 2 to 45 atomic percent.

5. A method in accordance with claim 1 wherein the oxygen doped polycrystalline silicon layer and the phosphorus doped polycrystalline silicon layer are annealed at the same time an oxide layer is thermally grown on the outer surface of said phosphorus doped polycrystalline silicon layer.

6. A method in accordance with claim 1 wherein the substrate is heated to a temperature of at least about 700° C. to maintain the reaction between said hexafluoride and the silicon until about 500 Angstroms to about 2,000 Angstroms of metal is deposited, thereafter, lowering the temperature of said substrate to a temperature in a range of between about 500° C. to about 650° C. and exposing said substrate to a mixture of hexafluoride and hydrogen whereby additional metal is deposited on said substrate.

7. A method in accordance with claim 6 wherein the ratio of hydrogen to hexafluoride is at least about 10:1.

8. A method in accordance with claim 1 wherein a phosphosilicate glass layer is grown over said phosphorus doped polycrystalline silicon layer before said refractory metal is deposited, said refractory metal being deposited by a chemical vapor deposition technique whereby the refractory metal does not form on said phosphosilicate glass and wherein a corrosion resistant metal layer is deposited over said refractory metal and an adjacent portion of said phosphosilicate glass layer.

* * * * *